(12) United States Patent
Citta et al.

(10) Patent No.: US 6,725,410 B2
(45) Date of Patent: Apr. 20, 2004

(54) INTERATIVE DECODER (75) Inventors: Richard W. Citta, Oak Park, IL (US); Jingsong Xia, Mundelein, IL (US)

(73) Assignee: Zenith Electronics Corporation, Lincolnshire, IL (US)

( * ) Notice: Subject to any disclaimer, the term of this patent is extended or adjusted under 35 U.S.C. 154(b) by 608 days.

(21) Appl. No.: 09/808,585

(22) Filed: Mar. 14, 2001

(65) Prior Publication Data
US 2002/0162067 A1 Oct. 31, 2002

(51) Int. Cl.[7] .............................................. H03M 13/00
(52) U.S. Cl. ...................................................... 714/755
(58) Field of Search ................................ 714/755, 758, 714/752, 746, 701, 702, 799, 800, 52, 48, 43

(56) References Cited

U.S. PATENT DOCUMENTS

| | | | | | |
|---|---|---|---|---|---|
| 4,336,612 A | * | 6/1982 | Inoue et al. | ................ | 714/755 |
| 6,029,264 A | * | 2/2000 | Kobayashi et al. | ......... | 714/755 |
| 6,272,659 B1 | * | 8/2001 | Zook | .......................... | 714/774 |
| 2003/0012228 A1 | * | 1/2003 | Tanaka et al. | .............. | 370/529 |

* cited by examiner

Primary Examiner—Christine T. Tu (57) ABSTRACT

An iterative decoding system has a first decoder that decodes coded data and a first weighting circuit that reduces channel effects in the coded data based upon a reliability that the first decoder accurately decoded the encoded data. The first weighting circuit produces improved coded data. A second decoder of the iterative decoding system decodes the improved coded data, and a second weighting circuit additionally reduces channel effects in the improved coded data based upon a reliability that the second decoder accurately decoded the improved encoded data.

44 Claims, 6 Drawing Sheets

INTERATIVE DECODER

TECHNICAL FIELD OF THE INVENTION

The present invention relates generally to an iterative decoder and, more particularly, to an iterative decoder in which data is improved after each decoding iteration.

BACKGROUND OF THE INVENTION AND PRIOR ART

In systems which communicate data through a channel from a transmitter to a receiver, it is known to code the data to be transmitted for a variety of reasons, though one of the primary reasons is usually to enhance its recovery by the receiver in spite of channel effects such as burst noise and ghosts resulting from multipath reception of the data. For example, a typical transmitter might interleave the data and convolutionally encode the interleaved data so that the data is less sensitive to burst noise and other signal impairments in the channel.

The receiver processes the data received from the channel usually in reverse order of the processing performed in the transmitter. Accordingly, a receiver decodes the data and then de-interleaves the decoded data. Some receivers are provided with iterative decoders that estimate the noise in the channel at each iteration with the objective that each noise estimation is intended to be better than the noise estimation from prior iterations. After a suitable number of iterations, the estimated noise is subtracted from the received signal and the received signal is then decoded to recover the transmitted data. It is noted that, in those prior art systems, the data itself is not improved by the iterations until after the final iteration when the estimated noise is removed from the received signal. By removing the noise from the received signal, it is hoped that the decoding can be performed more accurately.

The present invention is directed to an iterative decoder in which the data, instead of the noise estimation, is improved by the iterations.

SUMMARY OF THE INVENTION

In accordance with one aspect of the present invention, an iterative decoding system comprises first and second decoders. The first decoder decodes coded data, and the first decoder is arranged to reduce channel effects in the coded data to produce improved coded data. The second decoder decodes the improved coded data, and the second decoder is arranged to additionally reduce channel effects in the coded data.

In accordance with another aspect of the present invention, an iterative decoding system comprises first and second decoders and first and second data improvers. The first decoder decodes coded data. The first data improver reduces channel effects in the coded data based upon a reliability that the first decoder accurately decoded the encoded data so that the first data improver produces improved coded data. The second decoder decodes the improved coded data. The second data improver reduces channel effects in the improved coded data based upon a reliability that the second decoder accurately decoded the improved encoded data.

In accordance with still another aspect of the present invention, an encoding method comprises encoding un-coded data to produce first encoded data, encoding the un-coded data to produce second encoded data, and concatenating the un-encoded data, the first encoded data, and the second encoded data.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
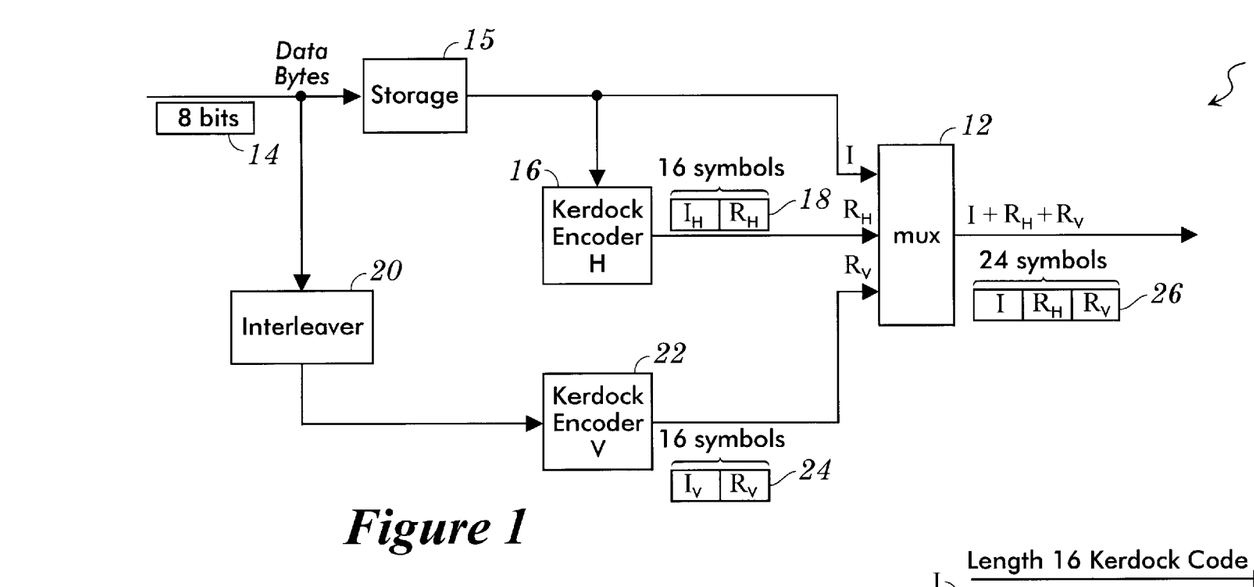
FIG. 1 is a schematic diagram of an encoding portion of a transmitter according to the present invention.

A portion of a transmitter 10 relevant to the present invention is shown in FIG. 1. The transmitter 10 includes a multiplexer 12 which receives at a first input thereof input data bytes to be transmitted. One such input data byte 14 is shown in FIG. 1 and, for example, may include eight data elements of data. A data element may be a bit, a symbol, or other unit of data.

A memory 15 is an n×n memory which stores n of the data bytes 14. For example, if there are eight bits in the data byte 14, then n=8 and the memory 15 is an 8×8 memory that stores eight rows each containing a corresponding data byte 14.

After the memory 15 stores a sufficient number of the data bytes 14, a first systematic Kerdock encoder 16 receives the stored data bytes in row order and encodes each data byte row as a corresponding double length output 18 (i.e., the double length output 18 of the first systematic Kerdock encoder 16 has twice as many data elements as its corresponding input data byte 14). The first half of the double length output 18 is encoded data $I_H$ and is the encoded version of the input data byte 14. The second half of the double length output 18 is redundant data $R_H$ and is based on the same input data byte 14.

The subscript H in $I_H$ and $R_H$ indicates that the encoded data $I_H$ and the redundant data $R_H$ are horizontal data. By convention, each of the input data bytes 14 is supplied horizontally to the multiplexer 12 and to the first systematic Kerdock encoder 16. Horizontal data are shown as rows of data in FIG. 2, where each row corresponds to an input data byte at the input of the first systematic Kerdock encoder 16, where the first portion of each row contains the encoded data $I_H$, and where the second portion of each row contains the redundant data $R_H$. For example, if eight data bits are provided in an input data byte at the input of the first systematic Kerdock encoder 16, the encoded data $I_H$ in a corresponding row contains eight data elements (which, as shown in FIG. 1, may be symbols) and the redundant data $R_H$ in the corresponding row also contains eight data elements (which, as shown in FIG. 1, also may be symbols). Thus, each row contains sixteen data elements. The double length output 18 is received at a second input of the multiplexer 12.

As shown in FIG. 1, the input data bytes are further supplied to a row-to-column interleaver 20. Let it be assumed that a first input data byte contains bits $a_0$ through $a_7$, that a second input data byte contains bits $b_0$ through $b_7$, . . . , and that an eighth input data byte contains bits $h_0$ through $h_7$. The systematic Kerdock encoder 16 receives from the memory 15 the first input data byte $a_0$ through $a_7$ as a row and encodes it to produce a first corresponding double length output having a corresponding $I_H$ and a corresponding $R_H$. The systematic Kerdock encoder 16 next receives from the memory 15 the second input data byte $b_0$ through $b_7$ as a row and encodes it to produce a second corresponding double length output having a corresponding $I_H$ and a corresponding $R_H$. . . . The systematic Kerdock encoder 16 next receives from the memory 15 the eighth input data byte ho through $h_7$ as a row and encodes it to produce an eighth corresponding double length output having a corresponding $I_H$ and a corresponding $R_H$.

The row-to-column interleaver 20, on the other hand, interleaves this data and converts it from row to column format so that this data exits the row-to-column interleaver 20 in the following order: $a_0, b_0, c_0, d_0, e_0, f_0, g_0, h_0, a_1, b_1, c_1, d_1, e_1, f_1, g_1, h_1, a_2, b_2, \ldots , g_6, h_6, a_7, b_7, c_7, d_7, e_7, f_7, g_7,$ and $h_7$. Accordingly, the data exiting the row-to-column interleaver 20 are vertical data. Vertical data are shown as columns of data in FIG. 2.

Each columnar byte of input data is supplied to a second systematic Kerdock encoder 22 which encodes each of the columnar bytes of data as a corresponding double length output 24 (i.e., the output of the second systematic Kerdock encoder 22 has twice as many data elements as an input columnar data byte). The first half of the double length output 24 is encoded data $I_V$ and is the encoded version of an input columnar data byte from the row-to-column interleaver 20. The second half of the double length output 24 is redundant data $R_V$ and is based on the same input columnar data byte. The first and second systematic Kerdock encoders 16 and 22 are well known in the art.

The systematic Kerdock encoder 22 receives from the row-to-column interleaver 20 a first data byte $a_0$ through $h_0$ as a column and encodes it to produce a first corresponding double length output having a corresponding $I_V$ and a corresponding $R_V$. The systematic Kerdock encoder 22 next receives from the row-to-column interleaver 20 a second data byte $a_1$ through $h_1$ as a column and encodes it to produce a second corresponding double length output having a corresponding $I_V$ and a corresponding $R_V$. . . . The systematic Kerdock encoder 16 next receives from the row-to-column interleaver 20 an eighth data byte $a_7$ through $h_7$ as a column and encodes it to produce an eighth corresponding double length output having a corresponding $I_H$ and a corresponding $R_H$.

Figure 2:
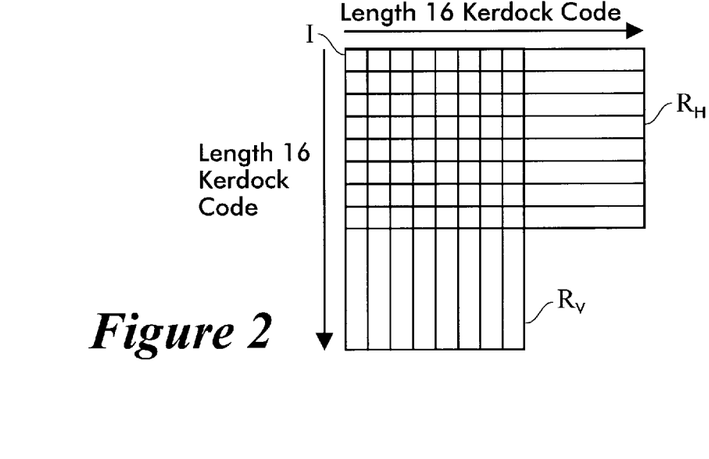
FIG. 2 is a diagram useful in explaining horizontal and vertical encoding which is performed by the encoding portion of the transmitter shown in FIG. 1.

Each column of FIG. 2 corresponds to a columnar data byte at the input of the second systematic Kerdock encoder 22. The first portion of each column contains the encoded data $I_V$, and the second portion of each column contains the redundant data $R_V$. For example, if eight bits are provided in a columnar data byte at the input of the second systematic Kerdock encoder 22, the encoded data $I_V$ in a column contains eight data elements (which, as shown in FIG. 1, may be symbols) and the redundant data $R_V$ in a column also contains eight data elements (which, as shown in FIG. 1, also may be symbols). Thus, each column contains sixteen data elements. The double length output 24 is received at a third input of the multiplexer 12.

Figure 3:
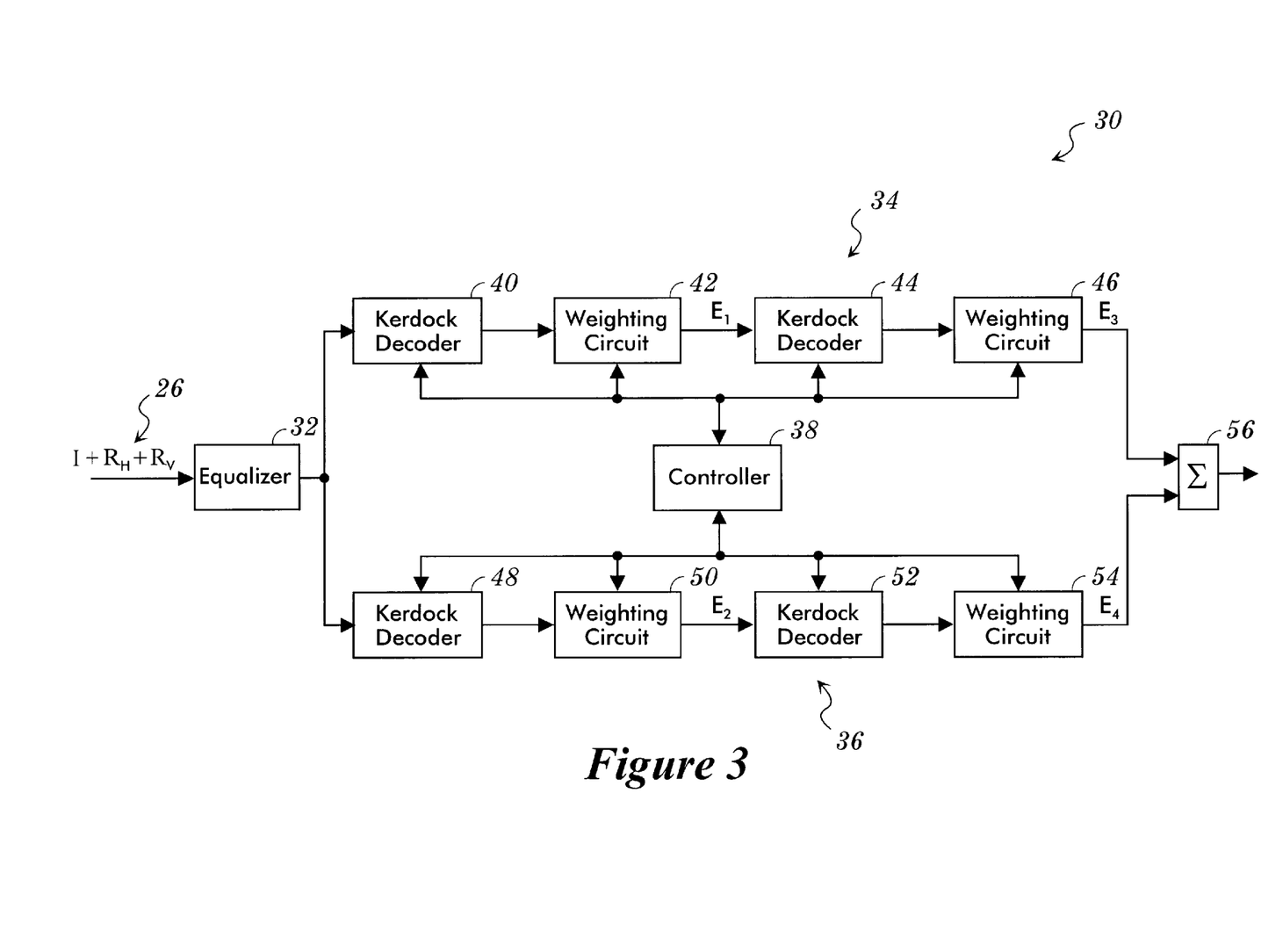
FIG. 3 is a schematic diagram of an iterative decoding portion of a receiver according to the present invention.

The multiplexer 12 is controlled so as to concatenate the input data byte 14 designated with the letter I at the first input of the multiplexer 12, the redundant data $R_H$ at the second input of the multiplexer 12, and the redundant data $R_V$ at the third input of the multiplexer 12. Thus, the encoded data $I_H$ and $I_V$ are not passed through the multiplexer 12. Accordingly, the multiplexer 12 provides a triple length output 26 comprising the original input data byte I followed by the redundant data $R_H$ followed by the redundant data $R_V$. For example, if the input data byte I, the redundant data $R_H$, and the redundant data $R_V$ each has eight data elements, the triple length output 26 has twenty-four data elements. The output of the multiplexer 12 is supplied either directly or indirectly to the channel for receipt by a receiver 30 whose portion relevant to the present invention is shown in FIG. 3.

Figure 8:
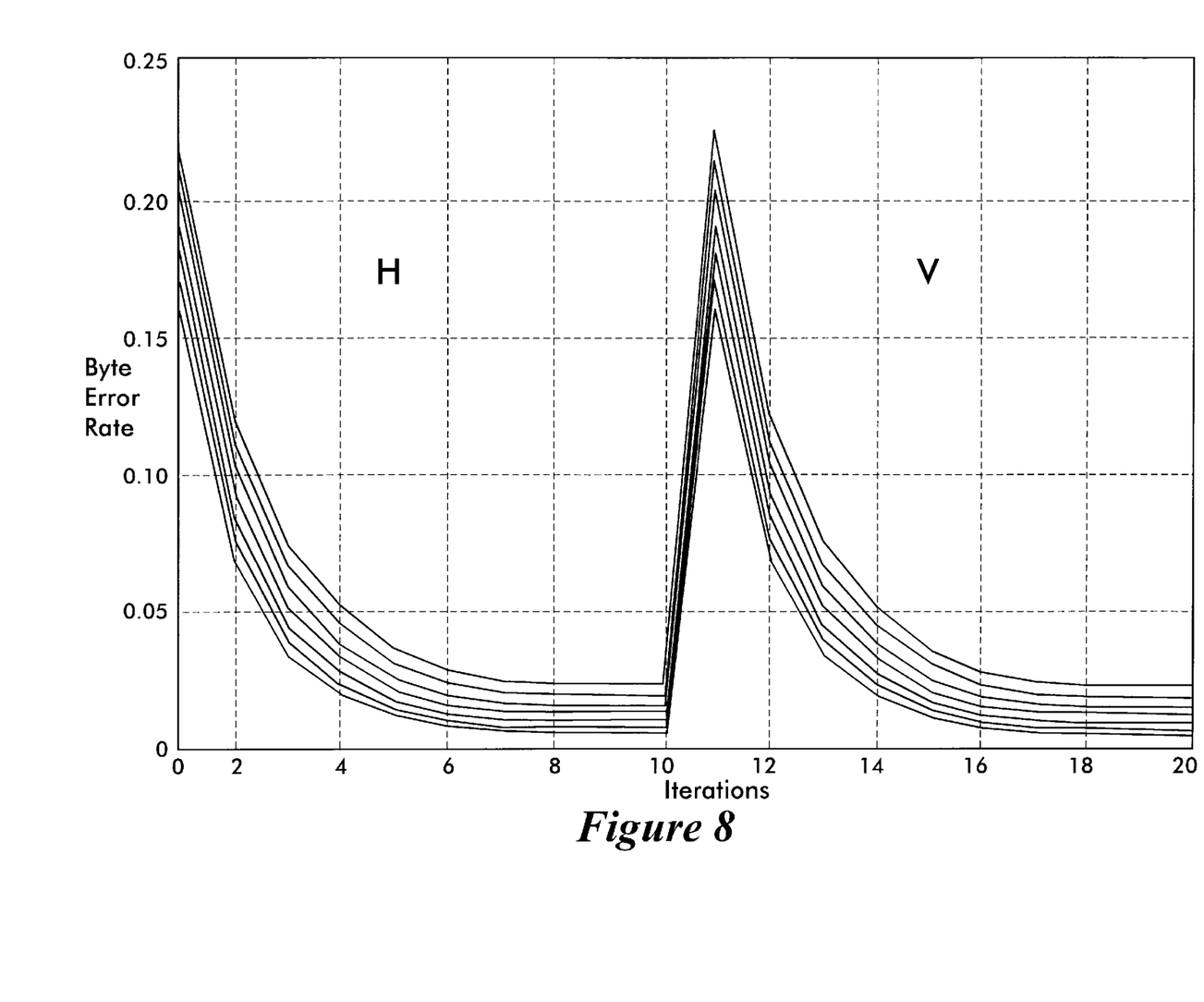

In an exemplary embodiment of the present invention, the receiver 30 uses each received input data byte I and its corresponding redundant data $R_H$ and $R_V$ to improve the received data after each iteration of decoding performed by an iterative decoder. Each decoding iteration of the receiver 30 essentially determines a reliability that the data is being properly decoded and adjusts the data according that reliability. Thus, channel effects are removed from the data by each iteration so that, at the end of the iterations, the output data of the receiver 30 is substantially the same as the original data supplied to the first input of the multiplexer 12. FIG. 8 is a graph showing that the byte error rate decreases after each iteration performed by the receiver 30

The receiver 30 is, accordingly, an iterative decoder and includes an equalizer 32 which equalizes each received triple length output 26 (comprising the concatenated input data byte I, the redundant data $R_H$ and the redundant data $R_V$). This equalized data is then processed in first and second channels 34 and 36 both of which are controlled by a controller 38 in a manner described below. The first channel 34 includes in series a Kerdock decoder 40, a weighting circuit 42, a Kerdock decoder 44, and a weighting circuit 46. The second channel 36 similarly includes in series a Kerdock decoder 48, a weighting circuit 50, a Kerdock decoder 52, and a weighting circuit 54. Outputs from the weighting circuits 46 and 54 are summed by a summer 56.

Figure 5:
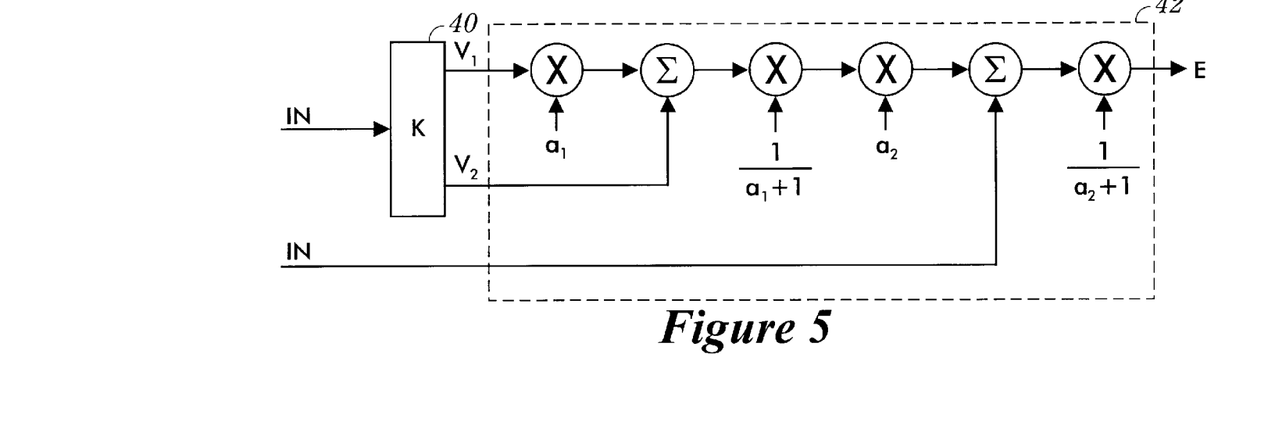
FIG. 5 is a diagram showing the operation of a weighting circuit of FIG. 3.

The Kerdock decoder 40, the Kerdock decoder 44, the Kerdock decoder 48, and the Kerdock decoder 52 operate as is well known in the art. The weighting circuit 42, the weighting circuit 46, the weighting circuit 50, and the weighting circuit 54 may all be constructed in like manner each operating in accordance with equation (1) described below, such that a representative one of these weighting circuits is shown in FIG. 5 and is discussed more fully below.

Figure 4:
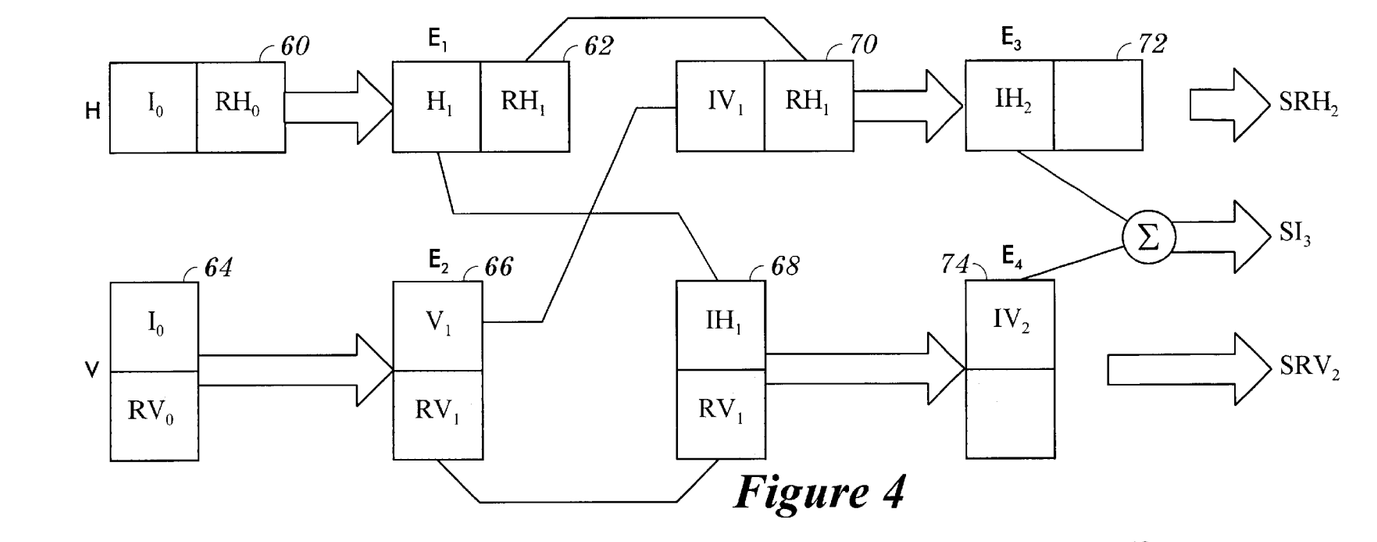
FIG. 4 is a diagram useful in explaining the flow of data through the decoding portion of the receiver shown in FIG. 3.

The controller 38 controls the first and second channels 34 and 36 so that data flows through the first and second channels 34 and 36 as shown in FIG. 4. Thus, the Kerdock decoder 40 receives rows of data each containing an input data byte I and its corresponding redundant data $R_H$ which are designated as $I_0$ and $RH_0$ in a data block 60 shown in FIG. 4. The number of rows contained in the data block 60 equals the number of data elements in an input data byte I, and the number of columns contained in the data block 60 equals the number of data elements in an input data byte I and in its corresponding redundant data $R_H$. In the example above where there are eight data elements in the input data byte I and eight data elements in the redundant data $R_H$, the data block 60 has eight rows and sixteen columns. Thus, the data block 60 contains eight horizontal data vectors each having sixteen data elements. The Kerdock decoder 40 decodes each row of the data block 60 one row at a time and in the usual manner to thus produce, per row, spectra containing coefficients.

Accordingly, when a row of the data block 60 designated IN herein is processed by the Kerdock decoder 40, this row IN and the two largest coefficients at the output of the Kerdock decoder 40 (where the largest coefficient is designated $V_1$ in FIG. 5 and the next largest coefficient is designated $V_2$ in FIG. 5) are supplied to the weighting circuit 42. As shown in FIG. 5, the weighting circuit 42 processes the coefficients $V_1$ and $V_2$ and the row IN in accordance with the following equation:

$$E_1 = \frac{a_2\left(\frac{a_1 V_1 + V_2}{a_1 + 1}\right) + IN}{a_2 + 1} \quad (1)$$

where $a_1$ and $a_2$ have values as discussed below, and where IN represents the input data row supplied to the Kerdock decoder 40. Thus, IN is essentially a vector having a plurality of data elements (i.e., sixteen in the above example). In accordance with equation (1), the following quantity is added to each data element of the vector IN:

$$a_2\left(\frac{a_1 V_1 + V_2}{a_1 + 1}\right) \quad (2)$$

Figure 6:
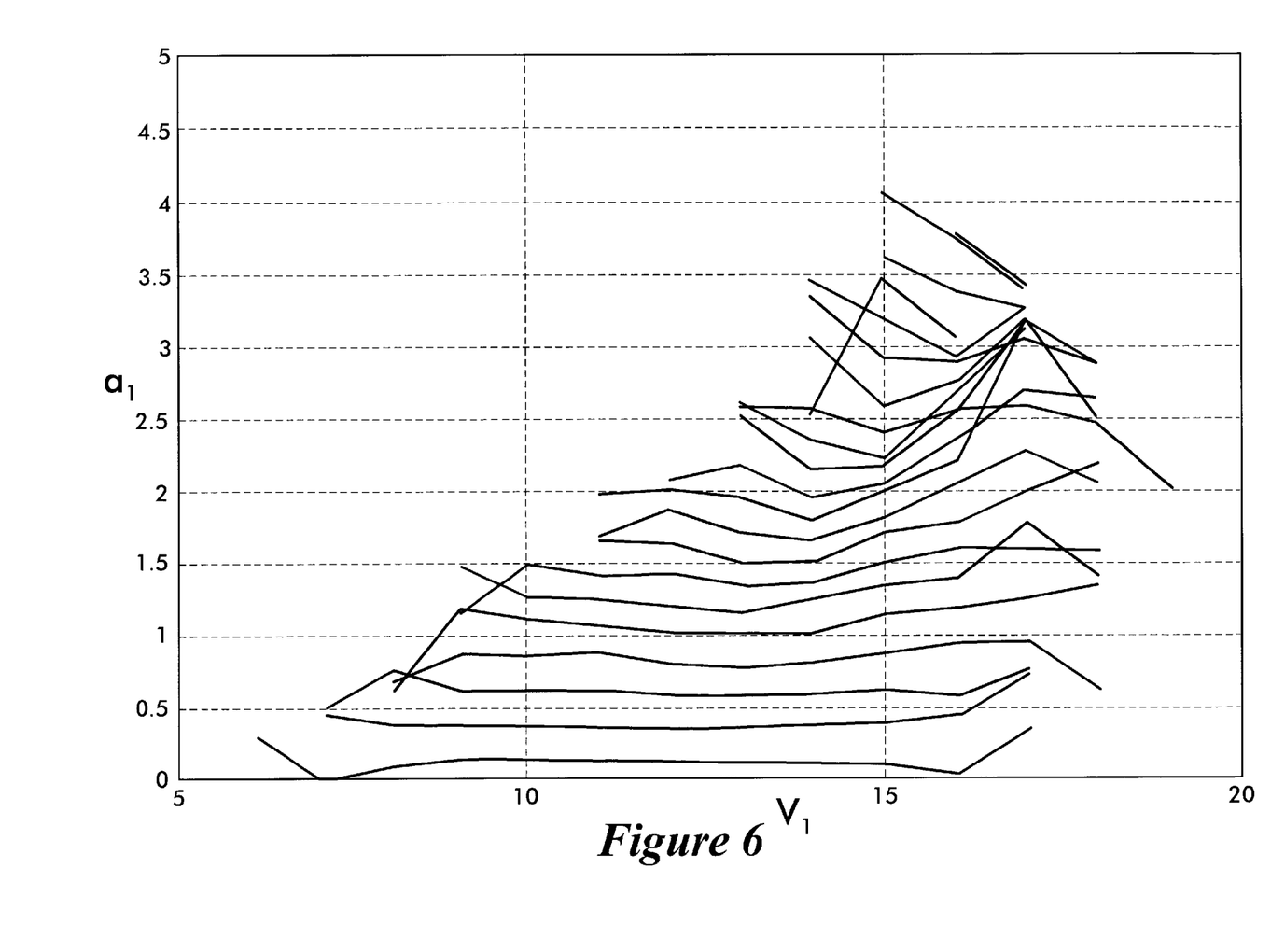
FIGS. 6 and 7 are graphs illustrating the data which can be used to determine weighting values useful to the weighting circuit shown in FIG. 6; and, FIG. 8 is an exemplary graph illustrating performance of the iterative decoder of the present invention.
Figure 7:
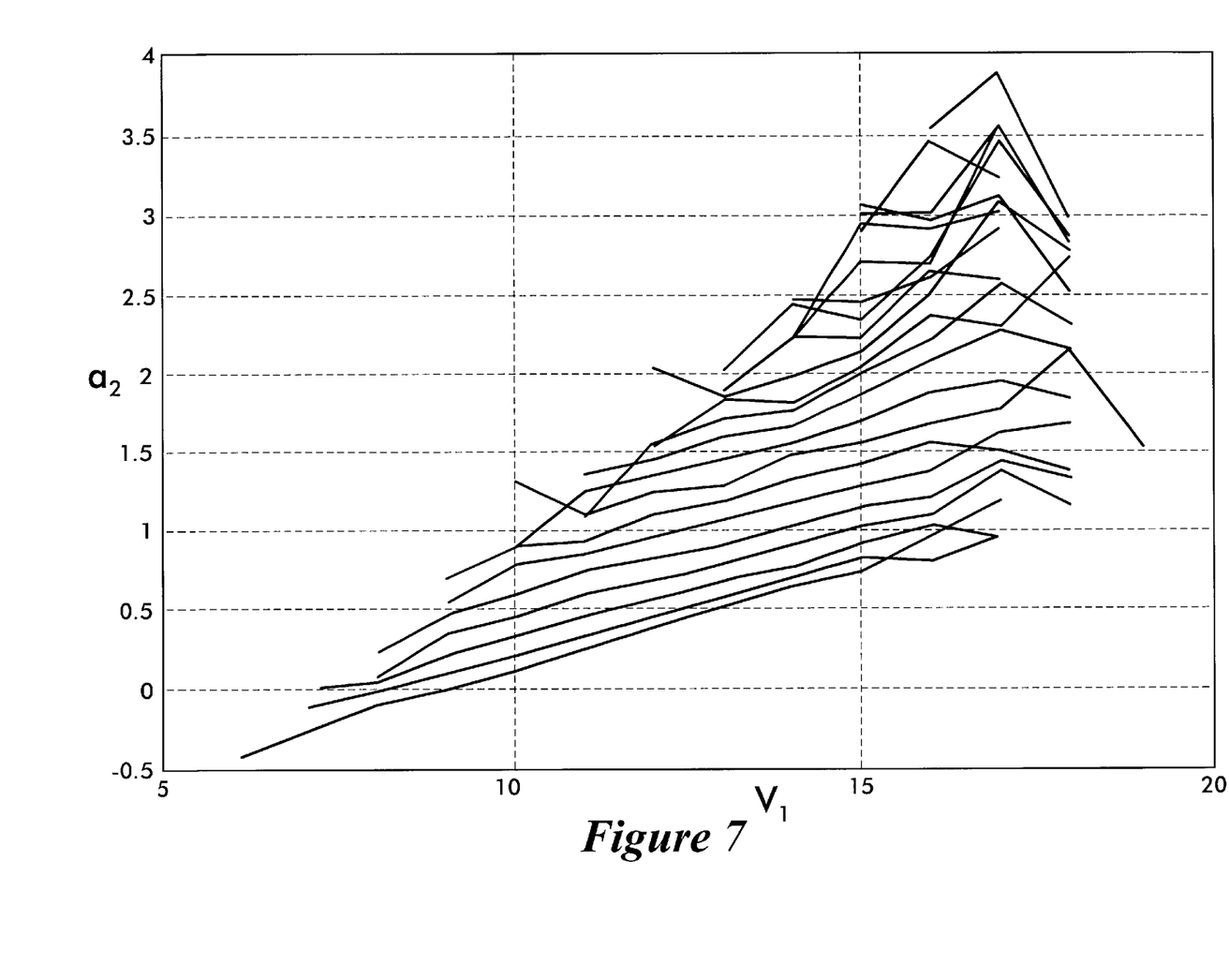

The controller 38 selects $a_1$ and $a_2$ based upon a measure of the reliability that the Kerdock decoder 40 has accurately decoded the row IN of the data block 60. For example, the controller 38 may select $a_1$ and $a_2$ based upon the coefficients from the Kerdock decoder 40. FIGS. 6 and 7 show graphs representing data that may be stored in a look up table, that is based upon the coefficients, and that may used to determine values for $a_1$ and $a_2$. In FIG. 6, the x-axis is the amplitude of the largest coefficient $V_1$, and the y-axis is the value of $a_1$ on a logarithmic scale. The plots in FIG. 6 represent various differences between the largest coefficient $V_1$ and the next largest coefficient $V_2$ produced by the Kerdock decoder 40. Accordingly, if the difference between the largest coefficient $V_1$ and the next largest coefficient $V_2$ is very small, as may be the case where noise in the channel has substantially corrupted the signal received by the receiver 30, the value of $a_1$ is selected to be small. As the difference between the largest coefficient $V_1$ and the next largest coefficient $V_2$ increases, as may be the case where the noise in the channel lessens, the selected value of $a_1$ increases.

Similarly, in FIG. 7, the x-axis is the amplitude of the largest coefficient $V_1$, and the y-axis is the value of $a_2$ on a logarithmic scale. The plots in FIG. 7 likewise represent various differences between the largest coefficient $V_1$ and the next largest coefficient $V_2$ produced by the Kerdock decoder 40. Accordingly, if the difference between the largest coefficient $V_1$ and the next largest coefficient $V_2$ is very small, as may be the case where noise in the channel has substantially corrupted the signal received by the receiver 30, the value of $a_2$ is selected to be small. As the difference between the largest coefficient $V_1$ and the next largest coefficient $V_2$ increases, as may be the case where the noise in the channel lessens, the selected value of $a_2$ increases.

As indicated by equation (1), the output of the weighting circuit corresponding to one input row IN is $E_1$. As each row of the data block 60 is processed by the Kerdock decoder 40 and the weighting circuit 42, the resulting corresponding output vector $E_1$ is supplied as a corresponding row of a data block 62 shown in FIG. 4.

The controller 38 controls the Kerdock decoder 48 so that it processes by columns each input data byte I and its redundant data $R_V$ which are designated by $I_0$ and $RV_0$ in a data block 64 shown in FIG. 4. The number of rows contained in the data block 64 equals the number of data elements in an input data byte I and its corresponding redundant data $R_H$, and the number of columns contained in the data block 64 equals the number of data elements in an input data byte I. In the example above where there are eight data elements in the input data byte I and eight data elements in the redundant data $R_H$, the data block 64 has sixteen rows and eight columns. Thus, the data block 64 contains eight vertical data vectors each having sixteen data elements.

The Kerdock decoder 48 decodes each column of the data block 64 in the usual manner and thus produces spectra containing coefficients for each column. The two largest coefficients at the output of the Kerdock decoder 48 (where the largest coefficient is designated $V_1$ in FIG. 5 and the next largest coefficient is designated $V_2$ in FIG. 5) corresponding to a column of processed data are supplied to the weighting circuit 50. As shown in FIG. 5, the weighting circuit 50 processes the coefficients $V_1$ and $V_2$ and a column of data IN from the data block 64 in accordance with equation (1). The controller 38 selects $a_1$ and $a_2$ from the look up table based upon the plots shown in FIGS. 6 and 7 in the manner described above. The weighting circuit 50 uses these values for $a_1$ and $a_2$ in equation (1) to produce an output $E_2$ corresponding to one column of the data block 64. Thus, as each column of the data block 64 is processed by the Kerdock decoder 48 and the weighting circuit 50, the resulting output vector $E_2$ is supplied as a corresponding column of a data block 66.

Under control of the controller 38, and as shown in FIG. 4, each row in the first half of the data block 62 is moved to a corresponding row in the first half of a data block 68, each row in the second half of the data block 62 is moved to a corresponding row in the second half of a data block 70, each column in the first half of the data block 66 is moved to a corresponding column in the first half of the data block 70, and each column in the second half of the data block 66 is moved to a corresponding column in the second half of the data block 68. Each row in the data block 70 is the input IN to the Kerdock decoder 44, and each column in the data block 68 is the input IN to the Kerdock decoder 52.

The Kerdock decoder 44 processes the data block 70 row by row in the manner described above in relation to the Kerdock decoder 40 in order to produce corresponding spectra containing coefficients. As in the case of the Kerdock decoder 40, the two largest coefficients at the output of the Kerdock decoder 44 (where the largest coefficient is designated $V_1$ in FIG. 5 and the next largest coefficient is designated $V_2$ in FIG. 5) and data IN corresponding to a row of data in the data block 70 are supplied to the weighting circuit 46. As shown in FIG. 5, the weighting circuit 46 processes the coefficients $V_1$ and $V_2$ and the data IN in accordance with equation (1). The controller 38 selects $a_1$ and $a_2$ from the look up table based upon the plots shown in FIGS. 6 and 7 in the manner described above. The weighting circuit 46 uses these values for $a_1$ and $a_2$ in equation (1) to produce an output $E_3$ for each row of the data block 70. As each row of the data block 70 is processed by the Kerdock decoder 44 and the weighting circuit 46, the resulting corresponding output vector $E_3$ is supplied as a corresponding row of a data block 72 shown in FIG. 4.

The Kerdock decoder 52 processes the data block 68 column by column in the usual manner to produce corresponding spectra containing coefficients. As in the case of the Kerdock decoder 48, the two largest coefficients at the output of the Kerdock decoder 52 (where the largest coefficient is designated $V_1$ in FIG. 5 and the next largest coefficient is designated $V_2$ in FIG. 5) and data IN corresponding to a column of data in the data block 68 are supplied to the weighting circuit 54. As shown in FIG. 5, the weighting circuit 54 processes the coefficients $V_1$ and $V_2$ and the data IN in accordance with equation (1). The controller 38 selects $a_1$ and $a_2$ from the look up table based upon the plots shown in FIGS. 6 and 7 as described above. The weighting circuit 54 uses these values for $a_1$ and $a_2$ in equation (1) to produce an output $E_4$ for each column row of the data block 68. As each column of the data block 68 is processed by the Kerdock decoder 52 and the weighting circuit 54, the resulting corresponding output vector $E_4$ is supplied as a corresponding column of a data block 74 shown in FIG. 4.

The summer 56 sums the data contained in the data blocks 72 and 74 such that the first data element in the first row of the data block 72 is summed with the first data element in the first column of the data block 74, the second data element in the first row of the data block 72 is summed with the second data element in the first column of the data block 74, and so on. Thus, if $72_{i,j}$ is used to designate a data element in row i and column j of the data block 72, and if $74_{i,j}$ is used to designate a data element in row i and column j of the data block 74, the summer 56 adds $72_{0,0}$ and $74_{0,0}$ to produce a first output data element of a first output data byte, the summer 56 adds $72_{0,1}$ and $74_{1,0}$ to produce a second output data element of the first output data byte, . . . , and the summer 56 adds $72_{0,7}$ $74_{7,0}$ to produce an eighth output data element of the first output data byte. Next, the summer 56 adds $72_{1,0\ and\ 740,1}$ to produce a first output data element of a second output data byte, the summer 56 adds $72_{1,1}$ and $74_{1,1}$ to produce a second output data element of the second output data byte, . . . , and the summer 56 adds $72_{1,7}$ and $74_{7,1}$ to produce an eighth output data element of the second output data byte, and so on.

Because of the row-to-column interleaving performed by the row-to-column interleaver 20 and of the use of the two channels for encoding and decoding, burst and other noise are unlikely to adversely affect the recovery of the input data bytes in the receiver 30. For example, if it is assumed that one row of data is effectively destroyed by burst noise, the weighting circuit 42 will give little weight to the output of the Kerdock decoder 40 corresponding to this row. Therefore, this row of data is essentially unrecoverable solely from the output of the Kerdock decoder 40 and the weighting circuit 42. However, the loss of this data row will have little effect on the processing performed by the Kerdock decoder 48 so that the Kerdock decoder 48 produces accurate decoded data which permits the weighting circuit 50 to give more weight to this data. The Kerdock decoders 44 and 52 and the weighting circuits 46 and 54 will further improve this data because of the cross coupling between the horizontal and vertical data. Thus, data can be recovered even in the presence of substantial burst and other noise.

Accordingly, the data is improved after each iteration of the decoding performed by the receiver 50. Moreover, the data produced at the output of the summer 56 is not interleaved. For each input byte of data I transmitted by the transmitter 10, the summer 56 produces substantially the same input byte of data I as a corresponding output data byte I that is substantially free of channel effects such as noise.

The data from the summer 56 can then be hard sliced in order to determine the original data elements of each data byte 14.

As an alternative to weighting circuits that adjust the data directly in order to produce their corresponding data estimates E by use of equation (1), the weighting circuits could be arranged to indirectly adjust the data (i) by adjusting the coefficients produced by their Kerdock decoders, and (ii) by Kerdock encoding the adjusted coefficients for supply to the next decoding stage in accordance with the data flow of FIG. 4. In this case, if the largest coefficient $V_1$ is large compared to all of the other coefficients, a value for a factor $\alpha_1$ may be selected to be large and a value for a factor $\alpha_2$ may be selected to be small. The factor $\alpha_1$ is applied to the coefficient $V_1$, and the factor $\alpha_2$ is applied to all other coefficients. For example, the coefficient $V_1$ may be multiplied by the factor $\alpha_1$, and all other coefficients may be multiplied by the factor $\alpha_2$.

However, if the largest coefficient $V_1$ and the next largest coefficient $V_2$ are comparable in size and are larger than the other coefficients, a smaller value for the factor $\alpha_1$ and a larger value for the factor $\alpha_2$ may be selected as compared to the case where the largest coefficient $V_1$ is large compared to all other coefficients. The factor $\alpha_1$ is applied to the coefficients $V_1$ and $V_2$, and the factor $\alpha_2$ is applied to all other coefficients. For example, the coefficients $V_1$ and $V_2$ may be multiplied by the factor $\alpha_1$, and all other coefficients may be multiplied by the factor $\alpha_2$.

In the case where all coefficients are small, as may happen when there is substantial noise in the channel, a very small value for the factor $\alpha_1$ may be selected and is applied to all coefficients so that the estimate is near zero. For example, all coefficients may be multiplied by the factor $\alpha_1$.

As a further alternative, the values for $a_1$ and $a_2$ may be selected by the weighting circuits 42, 46, 50, and 54 for use in equation (1) according to algorithms instead of the look up table represented by the plots of FIGS. 6 and 7. For example, if the largest coefficient $V_1$ is large compared to all of the other coefficients, a value for $a_1$ may be selected to be somewhat greater than one and a value smaller than 0.5 may be selected for $a_2$. If the largest coefficient $V_1$ and the next largest coefficient $V_2$ are comparable in size and are larger than the other coefficients, roughly equal values, such as 0.5, may be selected for $a_1$ and $a_2$. If all coefficients are small as may happen when there is substantial noise in the channel, a very small value for $a_1$ and a large value for $a_2$ may be selected.

Certain modifications of the present invention have been discussed above. Other modifications will occur to those practicing in the art of the present invention. For example, non-systematic encoders may be used in place of the systematic encoders. In this case, however, the data should be arranged to fill all four quadrants shown in FIG. 2.

Also, the memory 15 is provided so that the systematic Kerdock encoders 16 and 22 synchronously operate on each 8×8 block of input data so that one of the systematic Kerdock encoders 16 and 22 is not operating on data from one 8×8 block of data while the other of the systematic Kerdock encoders 16 and 22 is operating on data from a different 8×8 block of data. However, mechanisms other the memory 15 may be provided for this synchronization.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. An iterative decoding system comprising:
   a first decoder that decodes coded data, wherein the first decoder is arranged to reduce channel effects in the coded data to produce improved coded data; and,
   a second decoder that decodes the improved coded data, wherein the second decoder is arranged to additionally reduce channel effects in the coded data, wherein the first and second decoders are of the same decoder type.

2. The iterative decoding system of claim 1 wherein the coded data includes horizontally coded data and vertically coded data, and wherein the first and second decoders are arranged to decode the horizontally and vertically coded data so as to reduce channel effects in the coded data.

3. The iterative decoding system of claim 1 wherein the coded data includes horizontally coded data and vertically coded data, wherein the first and second decoders are arranged in first and second channels, wherein the first channel is arranged to at least initially process the horizontally coded data but not the vertically coded data, and wherein the second channel is arranged to at least initially process the vertically coded data but not the horizontally coded data.

4. The iterative decoding system of claim 3 wherein the first decoder comprises a first channel first decoder in the first channel and a second channel first decoder in the second channel, and wherein the second decoder comprises a first channel second decoder in the first channel and a second channel second decoder in the second channel.

5. The iterative decoding system of claim 4 wherein the first channel first decoder decodes the horizontally encoded data and is arranged to produce improved first channel data therefrom, wherein the second channel first decoder decodes the vertically encoded data and is arranged to produce improved second channel data therefrom, wherein the first channel second decoder decodes a first combination of the improved first and second channel data, and wherein the second channel second decoder decodes a second combination of the improved first and second channel data.

6. The iterative decoding system of claim 5 wherein the first and second combinations are different combinations of the improved first and second channel data.

7. The iterative decoding system of claim 5 wherein the first channel second decoder and the second channel second decoder produce corresponding outputs, wherein the iterative decoding system further comprises a summer, and wherein the summer sums the outputs of the first channel second decoder and the second channel second decoder.

8. The iterative decoding system of claim 1 wherein the coded data includes un-coded data, horizontally coded data, and vertically coded data, wherein the first and second decoders are arranged in first and second channels, wherein the first channel is arranged to at least initially process only the un-coded data and the horizontally coded data, and wherein the second channel is arranged to at least initially process only the un-coded data and the vertically coded data.

9. The iterative decoding system of claim 8 wherein the horizontally coded data is based upon horizontal encoding of the un-coded data, and wherein the vertically coded data is based upon vertical encoding of the un-coded data.

10. The iterative decoding system of claim 8 wherein the first decoder comprises a first channel first decoder in the first channel and a second channel first decoder in the second channel, and wherein the second decoder comprises a first channel second decoder in the first channel and a second channel second decoder in the second channel.

11. The iterative decoding system of claim 10 wherein the first channel first decoder decodes only the un-encoded data and the horizontally encoded data and is arranged to produce improved first channel data therefrom, wherein the second channel first decoder decodes only the un-encoded data and the vertically encoded data and is arranged to produce improved second channel data therefrom, wherein the first channel second decoder decodes a first combination of the improved first and second channel data, and wherein the second channel second decoder decodes a second combination of the improved first and second channel data.

12. The iterative decoding system of claim 11 wherein the first and second combinations are different combinations of the improved first and second channel data.

13. The iterative decoding system of claim 11 wherein the first channel second decoder and the second channel second decoder produce corresponding outputs, wherein the iterative decoding system further comprises a summer, and wherein the summer sums the outputs of the first channel second decoder and the second channel second decoder.

14. The iterative decoding system of claim 11 wherein the improved first channel data includes first improved un-encoded data and improved horizontally encoded data, wherein the improved second channel data includes second improved un-encoded data and improved vertically encoded data, wherein the first combination includes only the second improved un-encoded data and the improved horizontally encoded data, and wherein the second combination includes only the first improved un-encoded data and the improved vertically encoded data.

15. An iterative decoding system comprising:
   a first decoder that decodes coded data;
   a first data improver, wherein the first data improver is arranged to reduce channel effects in the coded data based upon a reliability that the first decoder accurately decoded the encoded data, and wherein the first data improver is arranged to produce improved coded data;
   a second decoder that decodes the improved coded data; and,
   a second data improver, wherein the second data improver is arranged to reduce channel effects in the improved coded data based upon a reliability that the second decoder accurately decoded the improved encoded data.

16. The iterative decoding system of claim 15 wherein the coded data includes horizontally coded data and vertically coded data, and wherein the first and second decoders and the first and second data improvers are arranged to decode the horizontally and vertically coded data so as to reduce channel effects in the coded data.

17. The iterative decoding system of claim 15 wherein the coded data includes horizontally coded data and vertically coded data, wherein the first and second decoders and the first and second data improvers are arranged in first and second channels, wherein the first channel is arranged to at least initially process only the horizontally coded data but not the vertically coded data, and wherein the second channel is arranged to at least initially process only the vertically coded data but not the horizontally coded data.

18. The iterative decoding system of claim 17 wherein the first decoder comprises a first channel first decoder in the first channel and a second channel first decoder in the second channel, wherein the first data improver comprises a first channel first data improver in the first channel and a second channel first data improver in the second channel, wherein the second decoder comprises a first channel second decoder in the first channel and a second channel second decoder in the second channel, and wherein the second data improver comprises a first channel second data improver in the first channel and a second channel second data improver in the second channel.

19. The iterative decoding system of claim 18 wherein the first channel first decoder decodes the horizontally encoded data, wherein the first channel first data improver is arranged to produce improved first channel data from an output of the first channel first decoder, wherein the second channel first decoder decodes the vertically encoded data, wherein the second channel first data improver is arranged to produce improved second channel data from an output of the second channel first decoder, wherein the first channel second decoder decodes a first combination of the improved first and second channel data, and wherein the second channel second decoder decodes a second combination of the improved first and second channel data.

20. The iterative decoding system of claim 19 wherein the first and second combinations are different combinations of the improved first and second channel data.

21. The iterative decoding system of claim 19 wherein the first channel second data improver is arranged to produce additionally improved first channel data from an output of the first channel second decoder, wherein the second channel second data improver is arranged to produce additionally improved second channel data from an output of the second channel second decoder, wherein the iterative decoding system further comprises a summer, and wherein the summer sums the additionally improved first and second channel data.

22. The iterative decoding system of claim 15 wherein the coded data includes un-coded data, horizontally coded data, and vertically coded data, wherein the first and second decoders and the first and second data improvers are arranged in first and second channels, wherein the first channel is arranged to at least initially process only the un-coded data and the horizontally coded data, and wherein the second channel is arranged to at least initially process only the un-coded data and the vertically coded data.

23. The iterative decoding system of claim 22 wherein the horizontally coded data is based upon horizontal encoding of the un-coded data, and wherein the vertically coded data is based upon vertical encoding of the un-coded data.

24. The iterative decoding system of claim 22 wherein the first decoder comprises a first channel first decoder in the first channel and a second channel first decoder in the second channel, wherein the first data improver comprises a first channel first data improver in the first channel and a second channel first data improver in the second channel, wherein the second decoder comprises a first channel second decoder in the first channel and a second channel second decoder in the second channel, and wherein the second data improver comprises a first channel second data improver in the first channel and a second channel second data improver in the second channel.

25. The iterative decoding system of claim 24 wherein the first channel first decoder decodes only the un-encoded data and the horizontally encoded data, wherein the first channel first data improver is arranged to produce improved first channel data from an output of the first channel first decoder, wherein the second channel first decoder decodes only the un-encoded data and the vertically encoded data, wherein the second channel first data improver is arranged to produce improved second channel data from an output of the second channel first decoder, wherein the first channel second decoder decodes a first combination of the improved first and second channel data, and wherein the second channel second decoder decodes a second combination of the improved first and second channel data.

26. The iterative decoding system of claim 25 wherein the first and second combinations are different combinations of the improved first and second channel data.

27. The iterative decoding system of claim 25 wherein the first channel second data improver is arranged to produce additionally improved first channel data from an output of the first channel second decoder, wherein the second channel second data improver is arranged to produce additionally improved second channel data from an output of the second channel second decoder, wherein the iterative decoding system further comprises a summer, and wherein the summer sums the additionally improved first and second channel data.

28. The iterative decoding system of claim 25 wherein the improved first channel data includes first improved un-encoded data and improved horizontally encoded data, wherein the improved second channel data includes second improved un-encoded data and improved vertically encoded data, wherein the first combination includes only the second improved un-encoded data and the improved horizontally encoded data, and wherein the second combination includes only the first improved un-encoded data and the improved vertically encoded data.

29. The iterative decoding system of claim 15 wherein the reliability that the first decoder accurately decoded the encoded data is determined by the first data improver based upon a largest coefficient produced by the first decoder, and wherein the reliability that the second decoder accurately decoded the encoded data is determined by the second data improver based upon a largest coefficient produced by the second decoder.

30. The iterative decoding system of claim 29 wherein the first data improver adjusts the coded data dependent upon the largest coefficient from the first decoder, and wherein the second data improver adjusts the improved coded data dependent upon the largest coefficient from the second decoder.

31. The iterative decoding system of claim 29 wherein the first data improver adjusts the coefficients produced by the first decoder dependent upon the largest coefficient from the first decoder and re-encodes the adjusted coefficients for supply to the second decoder, and wherein the second data improver adjusts the coefficients produced by the second decoder dependent upon the largest coefficient from the second decoder.

32. The iterative decoding system of claim 15 wherein the reliability that the first decoder accurately decoded the encoded data is determined by the first data improver based upon a largest coefficient and a next largest coefficient produced by the first decoder, and wherein the reliability that the second decoder accurately decoded the encoded data is determined by the second data improver based upon a largest coefficient and a next largest coefficient produced by the second decoder.

33. The iterative decoding system of claim 32 wherein the first data improver adjusts the coded data dependent upon the largest and next largest coefficients from the first decoder, and wherein the second data improver adjusts the improved coded data dependent upon the largest and next largest coefficients from the second decoder.

34. The iterative decoding system of claim 33 wherein the first data improver adjusts the coded data and the second data improver adjusts the improved coded data according to the following equation:

$$E = \frac{a_2\left(\frac{a_1 V_1 + V_2}{a_1 + 1}\right) + IN}{a_2 + 1}$$

wherein $V_1$ is the largest coefficient provided by the first or second decoder as appropriate, wherein $V_2$ is the next largest coefficient provided by the first or second decoder as appropriate, wherein $a_1$ and $a_2$ are chosen based upon at least $V_1$, wherein E is the output of the first or second data improver as appropriate, and wherein IN is the input to the first or second decoder as appropriate.

35. An encoding method comprising:

encoding un-coded data to produce first encoded data;

encoding the un-coded data to produce second encoded data; and, concatenating the un-encoded data, the first encoded data, and the second encoded data.

36. The encoding method of claim 35 wherein the encoding of the un-coded data to produce the first encoded data comprises horizontally encoding the un-coded data to produce the first encoded data, and wherein the encoding of the un-coded data to produce the second encoded data comprises vertically encoding the un-coded data to produce the second encoded data.

37. The encoding method of claim 36 wherein the encoding of the un-coded data to produce the second encoded data comprises performing a row-to-column interleaving of the un-coded data.

38. The encoding method of claim 35 wherein the first encoded data has first and second portions, wherein the first portion of the first encoded data is encoded data, wherein the second portion of the first encoded data is redundant encoded data, wherein the second encoded data has first and second portions, wherein the first portion of the second encoded data is encoded data, wherein the second portion of the second encoded data is redundant encoded data, and wherein the concatenation of the un-encoded data, the first encoded data, and the second encoded data comprises concatenating only the un-encoded data, the second portion of the first encoded data, and the second portion of the second encoded data.

39. The encoding method of claim 38 wherein the encoding of the un-coded data to produce the first encoded data comprises horizontally encoding the un-coded data to produce the first encoded data, and wherein the encoding of the un-coded data to produce the second encoded data comprises vertically encoding the un-coded data to produce the second encoded data.

40. The encoding method of claim 39 wherein the encoding of the un-coded data to produce the second encoded data comprises performing a row-to-column interleaving of the un-coded data.

41. The encoding method of claim 35 wherein the first encoded data has first and second portions, wherein the second encoded data has first and second portions, and wherein the concatenation of the un-encoded data, the first encoded data, and the second encoded data comprises concatenating only the un-encoded data, the second portion of the first encoded data, and the second portion of the second encoded data.

42. A decoding method comprising:

decoding a received signal in a first dimension to produce first decoded data and first redundant data;

decoding the received signal in a second dimension to produce second decoded data and second redundant data;

decoding the first decoded data with the second redundant data to produce third decoded data;

decoding the second decoded data with the first redundant data to produce fourth decoded data; and, combining the third and fourth decoded data.

43. The decoding method of claim 42 wherein the first dimension is a horizontal dimension, and wherein the second dimension is a vertical dimension.

44. The decoding method of claim 42 wherein the decoding of the first decoded data with the second redundant data to produce third decoded data comprises decoding of the first decoded data with the second redundant data to produce third decoded data and third redundant data, wherein the decoding of the second decoded data with the first redundant data to produce fourth decoded data comprises decoding of the second decoded data with the first redundant data to produce fourth decoded data and fourth redundant data, and wherein the combining of the third and fourth decoded data comprises combining the third and fourth decoded data but not the third and fourth redundant data.

* * * * *